(12) United States Patent
Kimura et al.

(10) Patent No.: US 11,168,977 B2
(45) Date of Patent: *Nov. 9, 2021

(54) THICKNESS MEASURING APPARATUS

(71) Applicant: DISCO CORPORATION, Tokyo (JP)

(72) Inventors: Nobuyuki Kimura, Tokyo (JP); Keiji Nomaru, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/840,704

(22) Filed: Apr. 6, 2020

(65) Prior Publication Data

US 2020/0340801 A1 Oct. 29, 2020

(30) Foreign Application Priority Data

Apr. 23, 2019 (JP) .............................. JP2019-081524

(51) Int. Cl.
| | |
|---|---|
| *G01B 11/06* | (2006.01) |
| *B24B 49/12* | (2006.01) |
| *B24B 7/22* | (2006.01) |
| *H01L 21/67* | (2006.01) |

(52) U.S. Cl.
CPC .......... *G01B 11/0675* (2013.01); *B24B 7/228* (2013.01); *B24B 49/12* (2013.01); *G01B 11/0625* (2013.01); *H01L 21/67253* (2013.01)

(58) Field of Classification Search
CPC ..... B24B 49/12; B24B 7/228; G01B 11/0625; G01B 11/0675; G01B 11/0683; G01B 2210/48; G01B 11/06; H01L 21/67253; H01L 22/12; H01L 22/26; H01L 21/304

USPC ........... 356/629–636, 639, 503, 237.2–237.6
See application file for complete search history.

(56) References Cited

U.S. PATENT DOCUMENTS

| 5,473,166 | A  | * | 12/1995 | Imai .......................... G03F 9/70 |
|---|---|---|---|---|
| | | | | 250/548 |
| 6,974,963 | B2 | * | 12/2005 | Tanaka ............. G01N 21/95607 |
| | | | | 250/548 |
| 10,228,551 | B1 | * | 3/2019 | Dietz .................. G01B 11/0608 |
| 2002/0057437 | A1 | * | 5/2002 | McMillen .......... G01B 11/0625 |
| | | | | 356/504 |
| 2004/0223165 | A1 | * | 11/2004 | Kurokawa ......... G01B 11/0633 |
| | | | | 356/630 |

(Continued)

FOREIGN PATENT DOCUMENTS

JP 2012021916 A 2/2012

*Primary Examiner* — Isiaka O Akanbi
(74) *Attorney, Agent, or Firm* — Greer, Burns & Crain, Ltd.

(57) ABSTRACT

A thickness measuring apparatus for measuring the thickness of a workpiece held on a chuck table includes the followings: a light source configured to emit white light; an optical branching unit configured to branch, to a second optical path, reflected light applied from the light source to the workpiece held on the chuck table via a first optical path and reflected from the workpiece; a diffraction grating disposed in the second optical path; an image sensor configured to detect an optical intensity signal of light separated into each wavelength by the diffraction grating; and a thickness output unit configured to generate a spectral interference waveform on the basis of the optical intensity signal detected by the image sensor, determine the thickness on the basis of the spectral interference waveform, and output the thickness.

21 Claims, 8 Drawing Sheets

(56) References Cited

U.S. PATENT DOCUMENTS

| | | | |
|---|---|---|---|
| 2006/0098206 A1* | 5/2006 | Kim | G01B 11/0675 |
| | | | 356/495 |
| 2011/0279822 A1* | 11/2011 | Kannaka | G01B 11/2441 |
| | | | 356/503 |
| 2013/0109112 A1* | 5/2013 | Grimbergen | G03F 1/80 |
| | | | 438/16 |
| 2019/0101373 A1* | 4/2019 | Ghim | G01B 11/0675 |

* cited by examiner

THICKNESS MEASURING APPARATUS

BACKGROUND OF THE INVENTION

Field of the Invention

The present invention relates to a thickness measuring apparatus that measures the thickness of a workpiece held on a chuck table.

Description of the Related Art

A wafer having a plurality of devices such as integrated circuits (ICs) or large scale integrations (LSIs) demarcated by a plurality of intersecting planned dividing lines and formed on a top surface of the wafer is thinned by grinding an undersurface of the wafer by a grinding apparatus and is thereafter divided into individual device chips by a dicing apparatus or a laser processing apparatus. The divided device chips are used in an electric apparatus such as a mobile telephone or a personal computer.

The grinding apparatus that grinds the undersurface of the wafer is constituted substantially of a grinding unit including a chuck table holding the wafer and a grinding wheel grinding the wafer held on the chuck table, in a rotatable manner, and thickness measuring means for measuring the thickness of the wafer held on the chuck table. The grinding apparatus can process the wafer to a desired thickness.

The use of the thickness measuring means of a contact type that measures the thickness of the wafer with a prober in contact with a grinding surface of the wafer may damage the grinding surface. Thickness measuring means of a non-contact type which measures the thickness by obtaining spectral interference waveforms of light reflected from the grinding surface of the wafer and light passing through the wafer and reflected from an opposite surface and by performing waveform analysis on the basis of the spectral interference waveform and a theoretical waveform function is therefore used (see Japanese Patent Laid-Open No. 2012-021916, for example).

SUMMARY OF THE INVENTION

The thickness measuring means described in Japanese Patent Laid-Open No. 2012-021916 mentioned above can measure the thickness of the wafer without damaging the top surface of the wafer. Here, when the thickness is measured by performing waveform analysis on the basis of the spectral interference waveform and the waveform function, a signal strength waveform needs to be obtained by subjecting the spectral interference waveform to waveform analysis based on a Fourier transform theory or the like, and an optical path length difference formed by the top surface and undersurface of the wafer on the basis of a peak value of the waveform, that is, thickness information, is obtained. However, accuracy in obtaining the thickness information on the basis of the peak value is decreased as the wafer becomes thinner. In addition, in a case where a material constituting the workpiece differs, a waveform shape of the spectral interference waveform differs for each material, and it is difficult to perform appropriate waveform analysis. In the case of a composite wafer laminated by a plurality of materials, in particular, the spectral interference waveform is formed on the basis of return light reflected and synthesized in each layer. It is thus difficult to detect the thickness of each layer.

It is accordingly an object of the present invention to provide a thickness measuring apparatus that can measure the thickness of a workpiece with ease and with high accuracy.

In accordance with an aspect of the present invention, there is provided a thickness measuring apparatus having a chuck table holding a workpiece and measuring a thickness of the workpiece held on the chuck table. The thickness measuring apparatus includes the following: a light source configured to emit white light; condensing means for condensing the white light emitted by the light source to the workpiece held on the chuck table; a first optical path communicating between the light source and the condensing means; an optical branching unit disposed in the first optical path, the optical branching unit branching reflected light reflected from the workpiece held on the chuck table to a second optical path; a diffraction grating disposed in the second optical path; an image sensor configured to detect an optical intensity signal of light separated into each wavelength by the diffraction grating; and thickness outputting means for generating a spectral interference waveform on a basis of the optical intensity signal detected by the image sensor, determining the thickness on a basis of the spectral interference waveform, and outputting the thickness. The thickness outputting means includes a reference waveform recording section configured to record spectral interference waveforms corresponding to a plurality of thicknesses as reference waveforms and a thickness determining section configured to check the spectral interference waveform generated on the basis of the optical intensity signal detected by the image sensor against the reference waveforms recorded in the reference waveform recording section and determine the thickness from a reference waveform that the spectral interference waveform matches. The reference waveform recording section has a plurality of material-specific reference waveform recording sections configured to record the reference waveforms according to a material constituting the workpiece.

Preferably, the thickness determining section of the thickness outputting means checks the spectral interference waveform generated on the basis of the optical intensity signal detected by the image sensor against the reference waveforms recorded in the plurality of material-specific reference waveform recording sections included in the reference waveform recording section and selects a material-specific reference waveform recording section to which the reference waveform that the spectral interference waveform matches belongs. Preferably, the condensing means includes condensing position changing means for changing a condensing position to which the white light is condensed in the workpiece, and the thickness is measured according to two or more kinds of materials constituting the workpiece.

Preferably, the workpiece is a composite wafer formed including at least a first layer and a second layer, or the workpiece is a composite wafer formed including at least a first layer and a second layer with the first layer or the second layer being formed of two or more kinds of materials in a planar direction. Preferably, the light source is one of a superluminescent diode (SLD) light source, an amplified spontaneous emission (ASE) light source, a supercontinuum light source, a light-emitting diode (LED) light source, a halogen light source, a xenon light source, a mercury light source, and a metal halide light source.

According to the present invention, the thickness can be measured with high accuracy according to the material constituting the workpiece. In addition, even in the case of a workpiece formed by a structure of two or more layers, thicknesses thereof can individually be measured with high accuracy according to a material in each layer.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
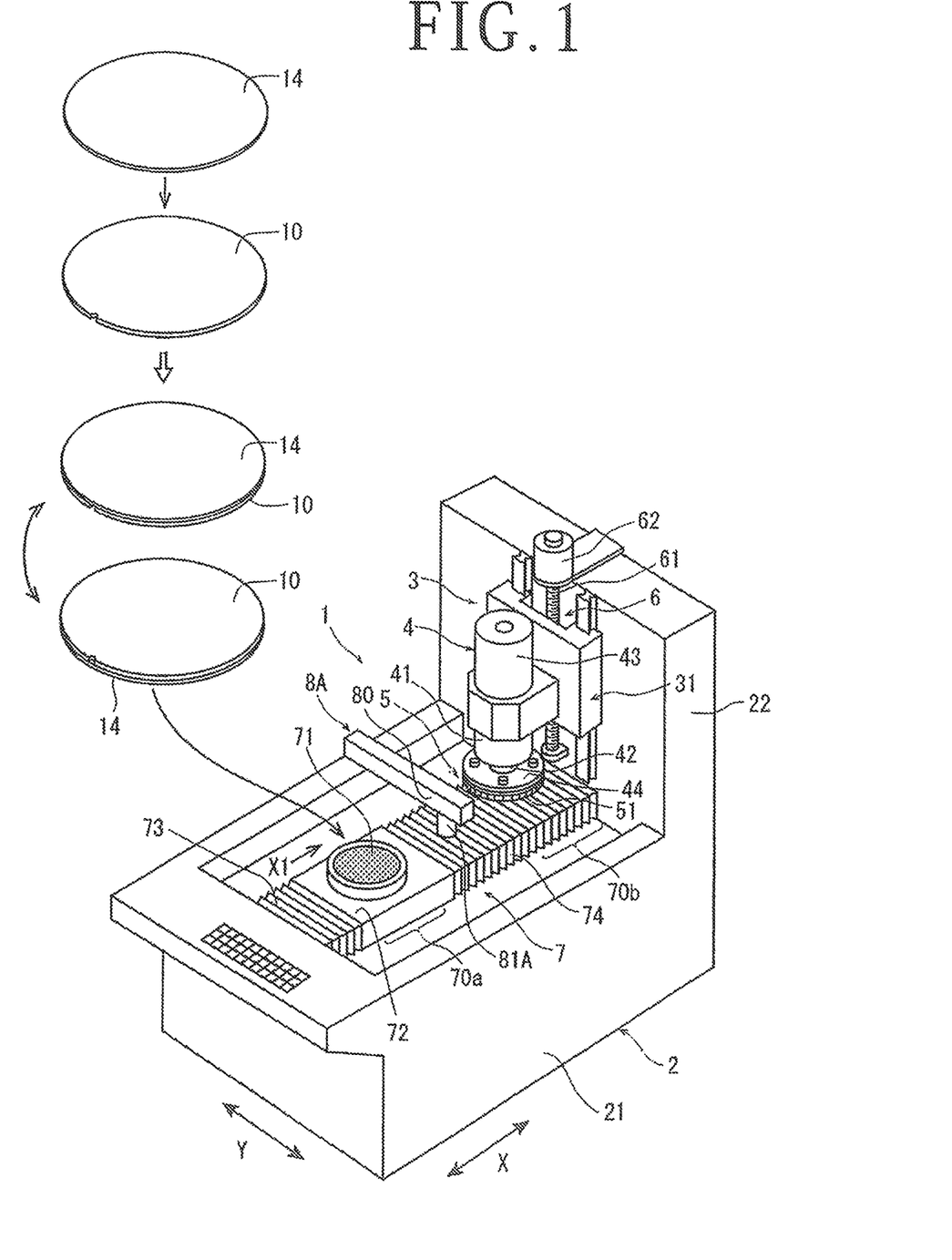
FIG. 1 is a general perspective view of a grinding apparatus in which a thickness measuring apparatus according to an embodiment of the present invention is disposed.

A thickness measuring apparatus according to embodiments of the present invention will hereinafter be described in detail with reference to the accompanying drawings. FIG. 1 depicts a general perspective view of a grinding apparatus 1 including a thickness measuring apparatus 8A according to the present embodiment and a wafer 10 as a workpiece whose thickness is measured by the thickness measuring apparatus 8A according to the present embodiment. The wafer 10 is, for example, formed by a LN (lithium niobate) substrate.

The grinding apparatus 1 depicted in FIG. 1 has an apparatus housing 2. The apparatus housing 2 includes a main portion 21 in a substantially rectangular parallelepipedic shape and an upright wall 22 provided to a rear end portion of the main portion 21 and extending upward. A grinding unit 3 as a grinding unit is vertically movably fitted to a front surface of the upright wall 22.

The grinding unit 3 includes a moving base 31 and a spindle unit 4 fitted to the moving base 31. The moving base 31 is configured to be engaged slidably with a pair of guide rails arranged on the upright wall 22. The spindle unit 4 as a grinding unit is attached via a supporting portion projecting forward to a front surface of the moving base 31 slidably fitted to the pair of the guide rails provided to the upright wall 22 as described above.

The spindle unit 4 includes a spindle housing 41, a spindle 42 rotatably disposed in the spindle housing 41, and a servomotor 43 as a driving source for rotation-driving the spindle 42. One end section (a lower end portion in FIG. 1) of the spindle 42 rotatably supported by the spindle housing 41 is disposed so as to protrude from a lower end of the spindle housing 41. A wheel mount 44 is provided to the lower end portion of the spindle 42. A grinding wheel 5 is attached to an undersurface of the wheel mount 44. A grinding stone 51 constituted of a plurality of segments is disposed on an undersurface of the grinding wheel 5.

The grinding apparatus 1 includes a grinding unit feed mechanism 6 that moves the grinding unit 3 in a vertical direction along the pair of guide rails. The grinding unit feed mechanism 6 includes a male screw rod 61 disposed on a front side of the upright wall 22 and extending substantially vertically and a pulse motor 62 as a driving source for rotation-driving the male screw rod 61 and includes a bearing member not depicted or the like that is provided to a back surface of the moving base 31 and screwed onto the male screw rod 61. When the pulse motor 62 performs normal rotation, the moving base 31, that is, the grinding unit 3, is lowered. When the pulse motor 62 performs reverse rotation, the moving base 31, that is, the grinding unit 3, is raised.

A chuck table mechanism 7 as holding means for holding the wafer 10 is disposed on the main portion 21 of the above-described apparatus housing 2. The chuck table mechanism 7 includes a chuck table 71, a cover member 72 covering a periphery of the chuck table 71, and bellows means 73 and 74 arranged in a front and in a rear of the cover member 72. The chuck table 71 is configured to suck and hold the wafer 10 on an upper surface (holding surface) of the chuck table 71 by actuating suction means not depicted in the figure. Further, the chuck table 71 is configured to be rotatable by rotation-driving means not depicted in the figure and is moved by chuck table moving means not depicted in the figure between a workpiece mounting area 70a and a grinding area 70b facing the grinding wheel 5 as depicted in FIG. 1 (in an X-axis direction indicated by an arrow X).

Incidentally, the servomotor 43, the pulse motor 62, the chuck table moving means not depicted in the figure, and the like described above are controlled by control means not depicted in the figure. In addition, a notch indicating a crystal orientation is formed in an outer circumferential portion of the wafer 10. A protective tape 14 as a protective member is affixed to a top surface side of the wafer 10. The wafer 10 is held on the upper surface (holding surface) of the chuck table 71 with the protective tape 14 side oriented downward.

The grinding apparatus 1 includes the thickness measuring apparatus 8A that measures the thickness of the wafer 10 held on the chuck table 71. The thickness measuring apparatus 8A has a measuring housing 80. As depicted in FIG. 1, the thickness measuring apparatus 8A is disposed on a side of a midpoint of a path in which the chuck table 71 is moved between the workpiece mounting area 70a and the grinding area 70b on an upper surface of the main portion 21 in a rectangular parallelepipedic shape which main portion constitutes the apparatus housing 2, the thickness measuring apparatus 8A is disposed so as to be movable in a region in which the chuck table 71 is moved between the workpiece mounting area 70a and the grinding area 70b, and the thickness measuring apparatus 8A is disposed so as to be able to measure the thickness of the wafer 10 held on the chuck table 71 from above. Disposed on an undersurface of a distal end portion of the measuring housing 80 is a condenser 81A that faces the chuck table 71 to be located directly below and that is provided as condensing means for condensing and applying white light for thickness measurement. The condenser 81A is configured to be able to be reciprocated in a direction indicated by an arrow Y in FIG. 1 (Y-axis direction) by driving means not depicted in the figure. Further, an optical system constituting the thickness measuring apparatus 8A will be described in more detail with reference to FIG. 2.

Figure 2:
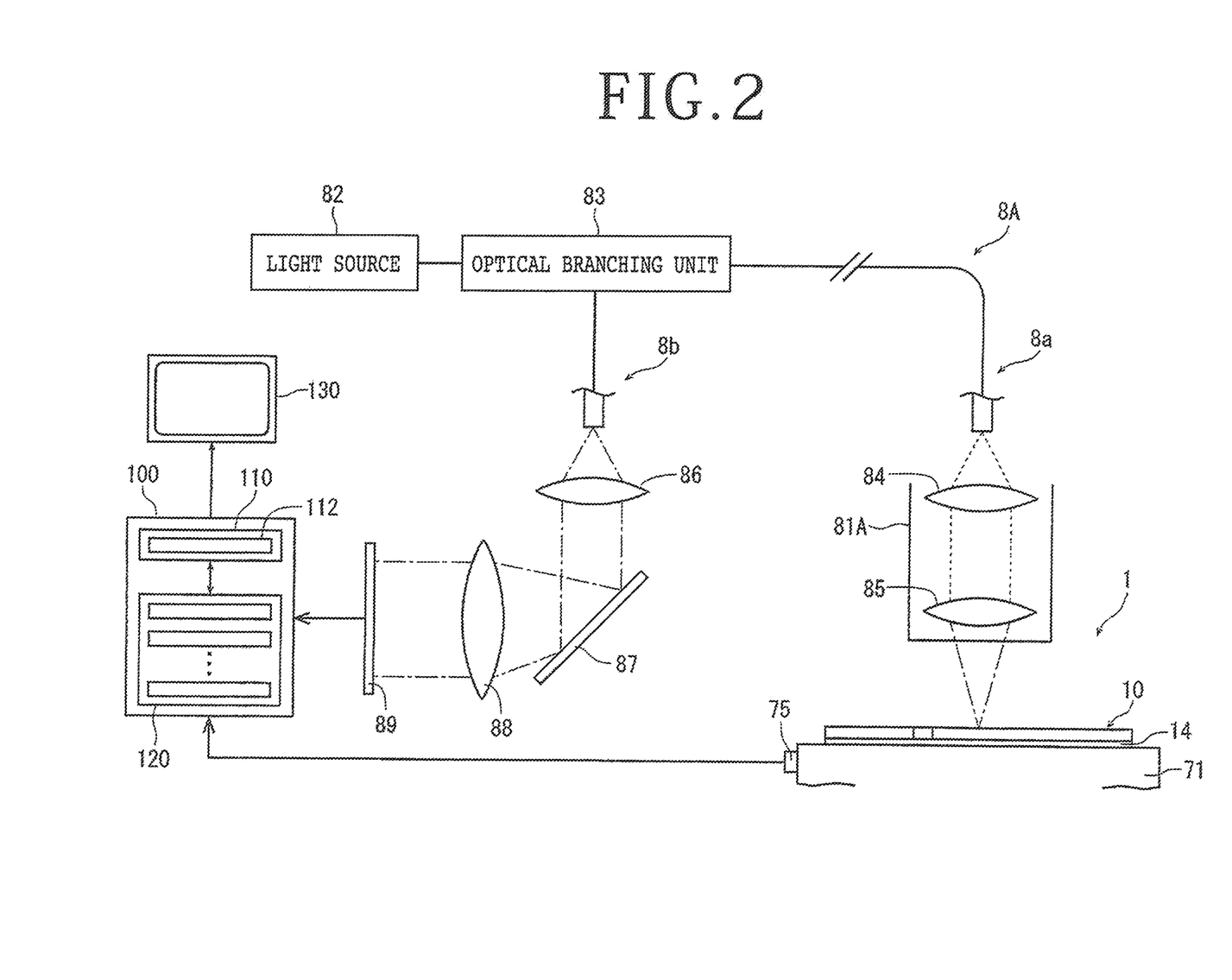
FIG. 2 is a block diagram of assistance in explaining an outline of the thickness measuring apparatus disposed in the grinding apparatus of FIG. 1.

As depicted in FIG. 2, the optical system constituting the thickness measuring apparatus 8A includes a light source 82 that emits the white light in a wide wavelength range which white light is to be applied to the chuck table 71, an optical branching unit 83 that guides the light from the light source 82 to a first optical path 8a and guides reflected light traveling backward in the first optical path 8a to a second optical path 8b, and the condenser 81A that condenses the light on the first optical path 8a to the wafer 10 held on the chuck table 71. The "light source that emits the white light" as referred to in the present invention is a light source that oscillates light having wavelengths of 400 to 800 nm which light is commonly referred to as visible light. The condenser 81A includes a collimation lens 84 that forms light on the first optical path 8a into collimated light and an objective lens 85 that condenses the light formed into the collimated light by the collimation lens 84 and guides the condensed light to the wafer 10.

A halogen lamp that oscillates light including the white light, for example, can be used as the light source 82. However, the light source 82 is not limited to the above-described halogen lamp. For example, it is possible to select, as the light source 82, as appropriate, a well-known light source such as an SLD light source, an ASE light source, a supercontinuum light source, an LED light source, a xenon light source, a mercury light source, or a metal halide light source that is commonly known and can emit the white light. A polarization maintaining fiber coupler, a polarization maintaining fiber circulator, a single mode fiber coupler, a single mode fiber coupler circulator, or the like can be used as the optical branching unit 83. Incidentally, a part of a path from the light source 82 to the optical branching unit 83, the first optical path 8a, and the second optical path 8b are formed by an optical fiber.

A collimation lens 86, a diffraction grating 87, a condensing lens 88, and an image sensor 89 are arranged on the second optical path 8b. The collimation lens 86 forms, into collimated light (collimated beam), reflected light that is reflected by the upper surface and lower surface of the wafer 10 held on the chuck table 71, that travels backward through the objective lens 85, the collimation lens 84, and the first optical path 8a, and that is guided from the optical branching unit 83 to the second optical path 8b. The diffraction grating 87 diffracts the above-described reflected light formed into collimated light by the collimation lens 86 and sends diffracted light corresponding to each wavelength to the image sensor 89 via the condensing lens 88. The image sensor 89 is what is generally called a line image sensor in which light receiving elements are linearly arranged. The image sensor 89 detects an intensity of light of each wavelength of the reflected light diffracted by the diffraction grating 87 and sends a light intensity signal to thickness outputting means 100.

The thickness outputting means 100 is formed by a computer. The thickness outputting means 100 includes the following: a central processing unit (CPU) that performs arithmetic processing according to a control program; a read-only memory (ROM) that stores the control program and the like; a readable and writable random access memory (RAM) for temporarily storing a detected detection value, a result of an operation, and the like; an input interface; and an output interface (details are not depicted). The thickness outputting means 100 generates a spectral interference waveform on the basis of the light intensity signal of each wavelength which signal is sent from the image sensor 89. The spectral interference waveform is temporarily stored in the RAM. The thickness outputting means 100 further includes a thickness determining section 110 that determines the thickness of the wafer 10 on the basis of the spectral interference waveform and a reference waveform recording section 120 that records spectral interference waveforms corresponding to a plurality of thicknesses as reference waveforms. The thickness determining section 110 includes a checking section 112 that checks the spectral interference waveform detected by the image sensor 89 and stored in the RAM against the reference waveforms recorded in the reference waveform recording section 120. Thickness information determined by the thickness determining section 110 can be stored in the RAM, external storing means, or the like as appropriate and be output to display means 130 as appropriate. The chuck table 71 is provided with position detecting means 75 for detecting the X and Y coordinate positions of the chuck table 71. Hence, a condensing position at which light is condensed by the condenser 81A is determined accurately. Incidentally, while the thickness outputting means 100 according to the present embodiment may be formed by an independent computer, the thickness outputting means 100 may be formed within control means not depicted that has various kinds of control programs controlling the grinding apparatus 1.

The reference waveform recording section 120 will be described in further detail with reference to FIG. 3. The reference waveform recording section 120, for example, includes material-specific reference waveform recording sections 122a to 122l in which reference waveforms are recorded according to materials constituting a workpiece. The material-specific reference waveform recording section 122a records a thickness (μm) of a Si (silicon) wafer and records, according to thickness, the reference waveforms of a spectral interference waveform generated on the basis of the light intensity signal detected by the image sensor 89 when the white light is applied from the condenser 81A of the thickness measuring apparatus 8A to the Si wafer. Similarly, the material-specific reference waveform recording section 122b records a thickness (μm) of a LN (lithium niobate) wafer and the reference waveforms of the spectral interference waveform. The material-specific reference waveform recording section 122c records a thickness (μm) of a GaN (gallium nitride) wafer and the reference waveforms of the spectral interference waveform. The material-specific reference waveform recording section 122d records a thickness (μm) of a SiO$_2$ (silicon dioxide) wafer and the reference waveforms of the spectral interference waveform. Incidentally, the above-described material-specific reference waveform recording sections 122a to 122d record the reference waveforms corresponding to wafers formed of a single material, and a part of data is omitted from the material-specific reference waveform recording sections 122a to 122d for the convenience of description.

In addition to the material-specific reference waveform recording sections 122a to 122d in which the reference waveforms are recorded so as to correspond to the above-described single materials, the reference waveform recording section 120 can include material-specific reference waveform recording sections 122k and 122l assuming cases where a wafer as a workpiece is a composite wafer including a plurality of layers (a first layer (upper layer) and a second layer (lower layer)) formed by two or more kinds of materials.

Figure 3:
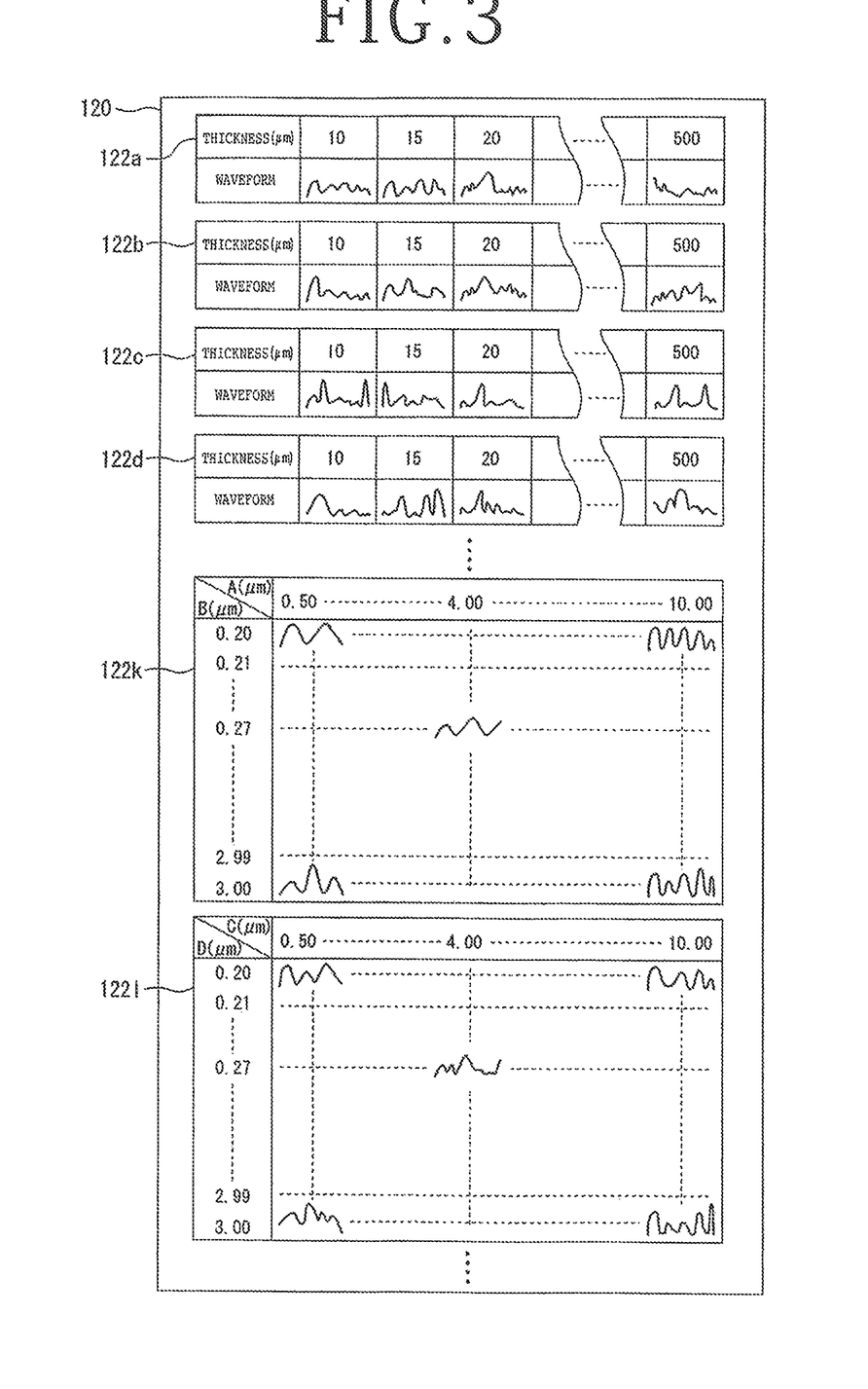
FIG. 3 is a schematic diagram depicting an outline of material-specific reference waveform recording sections arranged in the thickness measuring apparatus depicted in FIG. 2.

In the material-specific reference waveform recording section 122k in FIG. 3, the first layer is an A-layer (LN) and the second layer is a B-layer ($SiO_2$ layer), and the reference waveforms of the spectral interference waveform generated when the white light is condensed and applied from the condenser 81A are recorded in a matrix table formed for each thickness of the A-layer and the B-layer. In the matrix table, the reference waveforms are recorded with an axis of abscissas corresponding to a thickness (μm) of the A-layer and with an axis of ordinates corresponding to a thickness (μm) of the B-layer, and the thicknesses of the A-layer and the B-layer can be determined individually on the basis of the reference waveforms. Further, in the material-specific reference waveform recording section 122l, the first layer is a C-layer (LN) and the second layer is a D-layer (GaN), and as those in the material-specific reference waveform recording section 122k, the reference waveforms of the spectral interference waveform generated when the white light is applied from the condenser 81A are recorded in a matrix table formed for each thickness of the C-layer and the D-layer. While FIG. 3 depicts the material-specific reference waveform recording sections 122k and 122l related to two composite wafers, the reference waveform recording section 120 may record a material-specific reference waveform recording section assuming a composite wafer formed of layers of yet other materials. Incidentally, the reference waveforms recorded in the reference waveform recording section 120 can be obtained as theoretical waveforms resulting from operation by a computer.

The grinding apparatus 1 and the thickness measuring apparatus 8A according to the present embodiment substantially have the configuration as described above. The following description will be made of a mode of grinding processing that grinds the wafer 10 to a target finished thickness while measuring the thickness of the wafer 10 by using the grinding apparatus 1 in which the above-described thickness measuring apparatus BA is disposed.

Figure 4:
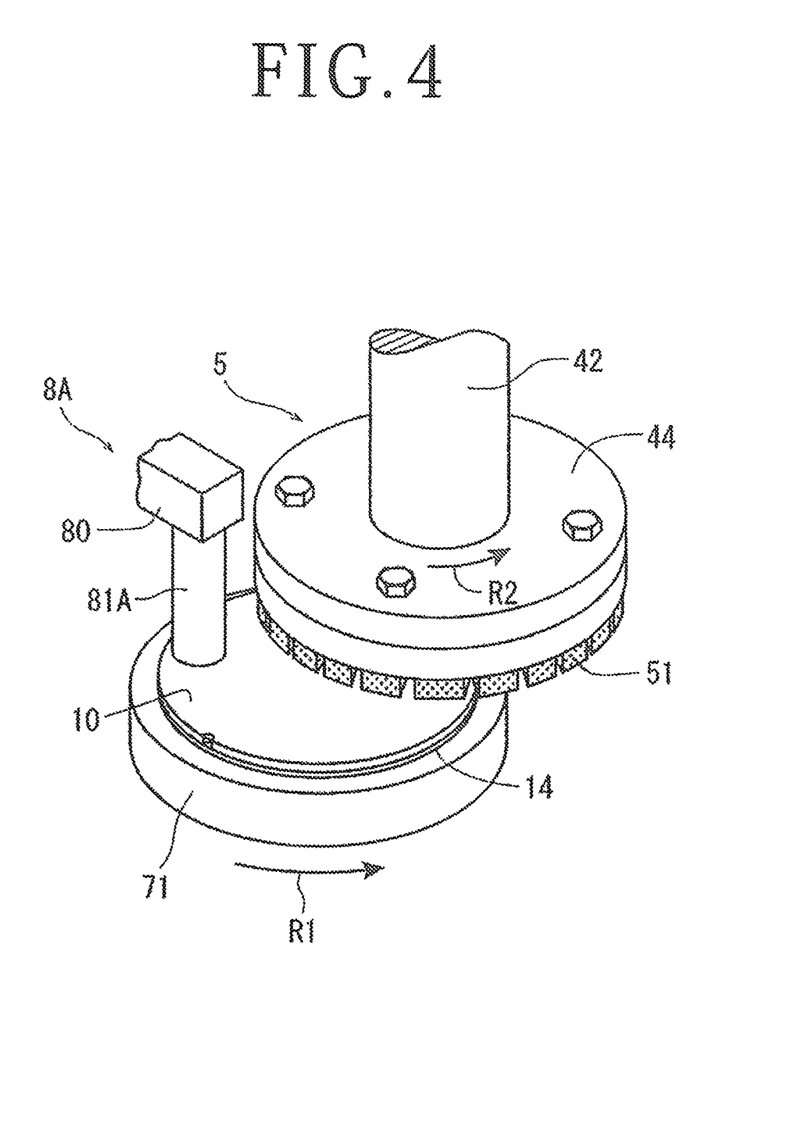
FIG. 4 is a fragmentary enlarged perspective view depicting a mode of a grinding step performed by the grinding apparatus depicted in FIG. 1.

First, in performing the grinding processing, an operator sets the target finished thickness of the wafer 10 by using an operating panel of the grinding apparatus 1. The target finished thickness of the wafer 10 in the present embodiment is assumed to be 20 μm. As depicted in FIG. 1, the protective tape 14 is affixed to the top surface side of the wafer 10, and the wafer 10 is mounted on the chuck table 71 positioned in the workpiece mounting area 70a with the protective tape 14 side oriented downward. Then, the wafer 10 is sucked and held on the chuck table 71 by actuating suction means not depicted in the figure. After the wafer 10 is sucked and held on the chuck table 71, the chuck table 71 is moved from the workpiece mounting area 70a side in a direction indicated by an arrow X1 in an X-axis direction by actuating moving means not depicted in the figure and is positioned in the grinding area 70b. The chuck table 71 is positioned such that the outer peripheral edges of a plurality of grinding stones 51 of the grinding wheel 5 passes through a center of rotation of the chuck table 71, as depicted in FIG. 4. Then, the thickness measuring apparatus 8A is moved in the direction indicated by the arrow X1 and is positioned at a thickness measuring position above the wafer 10 held on the chuck table 71.

After the grinding wheel 5 and the wafer 10 held on the chuck table 71 are set in a predetermined positional relation as described above and the thickness measuring apparatus 8A is positioned at the thickness measuring position as described above, the chuck table 71 is rotated in a direction indicated by an arrow R1 in FIG. 4 at a rotational speed of 300 rpm, for example, by rotation-driving means not depicted in the figure being driven, and the grinding wheel 5 is rotated in a direction indicated by an arrow R2 at a rotational speed of 6000 rpm, for example. Then, the grinding wheel 5 is lowered (grinding feed) by normal rotation driving of the pulse motor 62 of the grinding unit feed mechanism 6, and the plurality of grinding stones 51 are pressed against the wafer 10 under a predetermined pressure. As a result, the grinding target surface of the wafer 10 is ground (grinding step).

Figure 5A:
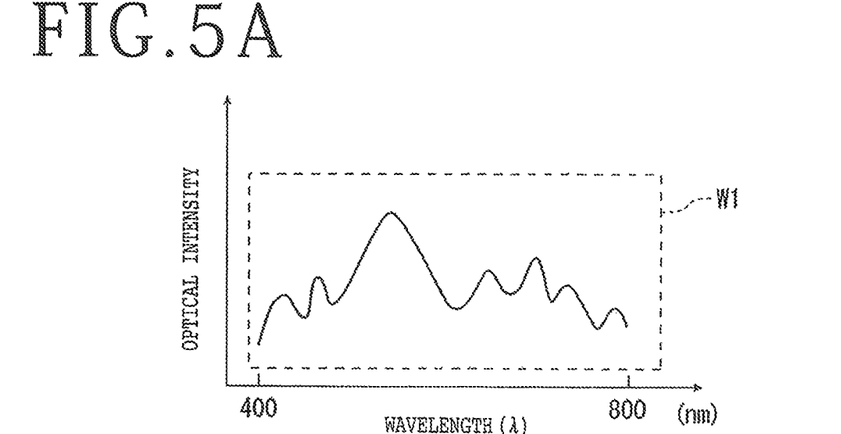
FIG. 5A is an example of a spectral interference waveform generated on the basis of an optical intensity signal detected by an image sensor.

The thickness outputting means 100 of the thickness measuring apparatus 8A measures the thickness of the wafer 10 in the state of being held on the chuck table 71 while the above-described grinding step is performed. More specifically, the white light oscillated by the light source 82 is condensed by the condenser 81A and applied to the wafer 10, a spectral interference waveform W1 depicted in FIG. 5A is generated on the basis of the light intensity signal from the image sensor 89, and the spectral interference waveform W1 is recorded in the RAM of the thickness outputting means 100. After the spectral interference waveform W1 is generated, the checking section 112 of the thickness determining section 110 checks the spectral interference waveform W1 stored in the RAM against the reference waveforms of the respective material-specific reference waveform recording sections 122a to 122l of the reference waveform recording section 120. As a result, it is determined that a reference waveform Wa whose waveform and phase match those of the spectral interference waveform W1 belongs to the material-specific reference waveform recording section 122b in the reference waveform recording section 120 depicted in FIG. 5B, and the material-specific reference waveform recording section 122b is selected. That is, it is confirmed that the wafer 10 is constituted of a LN substrate.

Figure 5B:
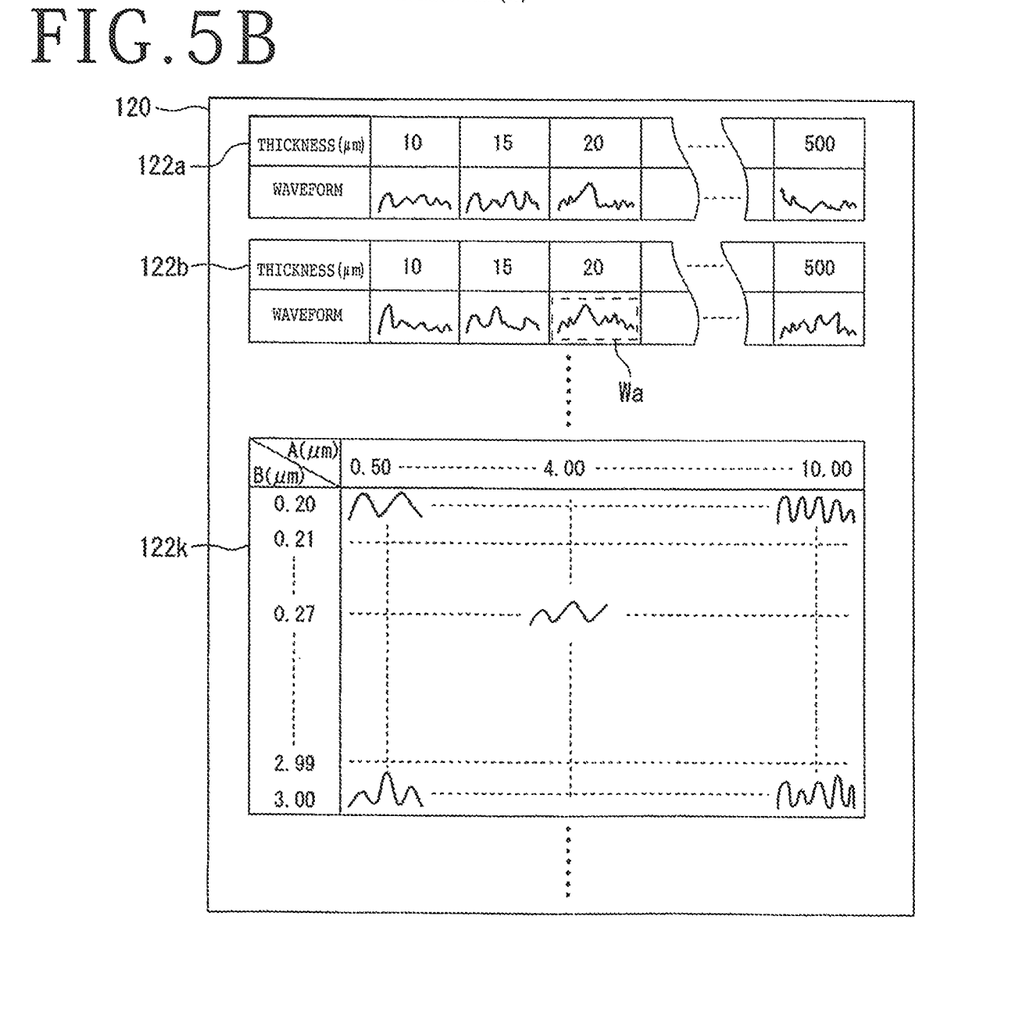
FIG. 5B is a diagram depicting a mode in which a check is made for a reference waveform matching the spectral interference waveform depicted in FIG. 5A and a thickness is determined.

When the thickness determining section 110 determines that a shape of the spectral interference waveform W1 and the reference waveform Wa belonging to the material-specific reference waveform recording section 122b match each other as described above, a thickness (20 μm) corresponding to a position at which the reference waveform Wa is recorded in the material-specific reference waveform recording section 122b is determined as the thickness of the wafer 10, is output from the thickness outputting means 100 to the display means 130, and is stored in the RAM. The thickness of the wafer 10 thus output from the thickness outputting means 100 is transmitted to control means not depicted in the grinding apparatus 1. Whether or not the thickness of the wafer 10 thus output from the thickness outputting means 100 has reached the target finished thickness (20 μm) of the wafer 10 is determined. When it is determined that the target thickness is reached as described above, the grinding step can be ended.

In the foregoing embodiment, an example in which the thickness of the wafer 10 constituted of a single material (LN) is measured by using the thickness measuring apparatus 8A including the condenser 81A that condenses the white light emitted from the light source 82 to a predetermined position has been illustrated. However, the present invention is not limited to this. According to the present invention, it is possible to include condensing position changing means that can change, as appropriate, the condensing position to which the white light is condensed in the workpiece on the chuck table 71 and to individually output thicknesses of respective layers of a composite wafer 10W in which two or more kinds of materials form the first layer (A-layer) and the second layer (B-layer). A thickness measuring apparatus 8B including the condensing position changing means will be described more specifically with reference to FIG. 6 and FIG. 7. Incidentally, description of configurations common to the thickness measuring apparatus 8B depicted in FIG. 6 and the above-described thickness measuring apparatus 8A will be omitted.

Figure 6:
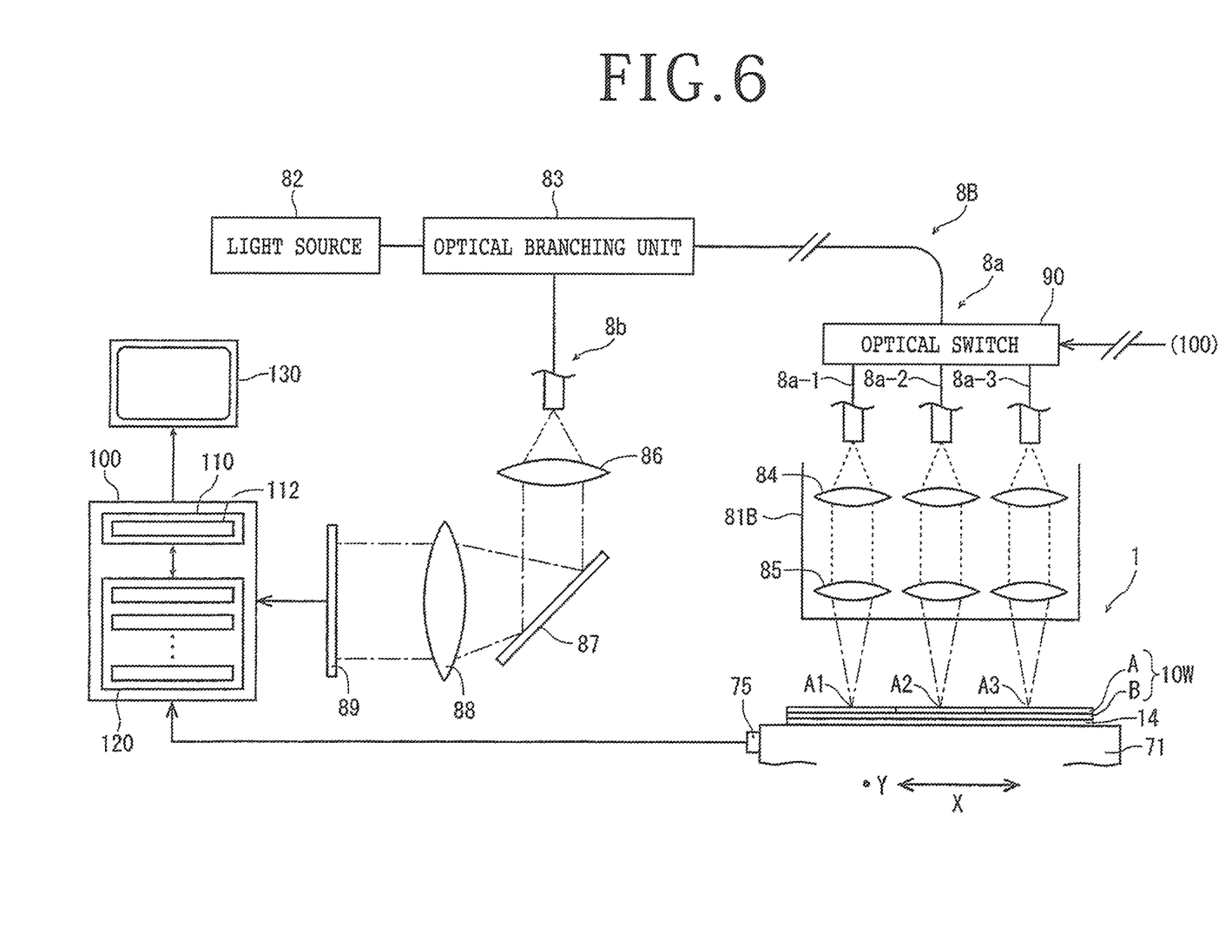
FIG. 6 is a block diagram depicting another embodiment of the thickness measuring apparatus.
Figure 7A:
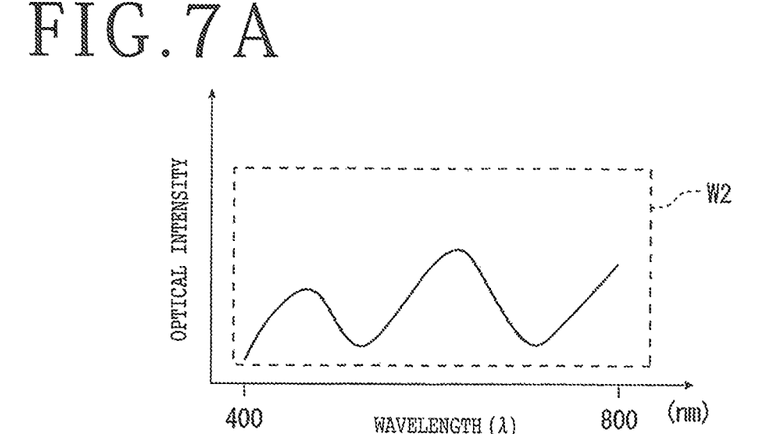
FIG. 7A is a diagram depicting a spectral interference waveform generated on the basis of an optical intensity signal detected by an image sensor of the thickness measuring apparatus depicted in FIG. 6.
Figure 7B:
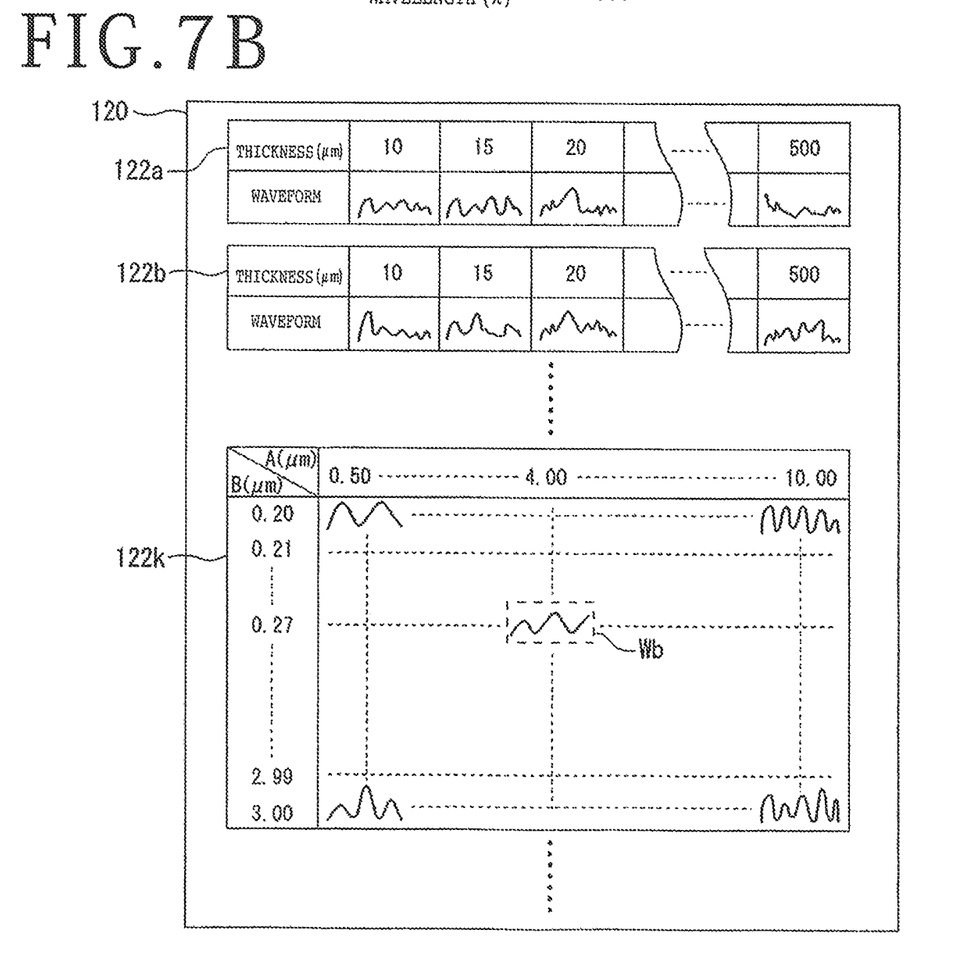
FIG. 7B is a diagram depicting a mode in which a check is made for a reference waveform matching the spectral interference waveform depicted in FIG. 7A, and the thicknesses of respective layers of a composite wafer are determined individually.

The thickness measuring apparatus 8B depicted in FIG. 6 includes an optical switch 90 on the first optical path 8a, the optical switch 90 branching the white light to one of a first branch path 8a-1, a second branch path 8a-2, and a third branch path 8a-3 to change the condensing position of the white light transmitted through the first optical path 8a according to an instruction signal from the thickness outputting means 100. The white light branched by the optical switch 90 is guided to a condenser 81B including a collimation lens 84 and an objective lens 85 corresponding to each branch path. Here, for example, the white light is guided to the first branch path 8a-1 by the optical switch 90 and is condensed by the condenser 81B. The white light is condensed to a condensing position A1 of the composite wafer 10W and then reflected light is formed. A spectral interference waveform W2 depicted in FIG. 7A is generated on the basis of the light intensity signal detected by the image sensor 89 at the time of the formation of the reflected light.

After the spectral interference waveform W2 depicted in FIG. 7A is generated, the spectral interference waveform W2 is recorded in the RAM of the thickness outputting means 100. After the spectral interference waveform W2 is thus generated, the checking section 112 of the thickness determining section 110 checks the spectral interference waveform W2 stored in the RAM against the reference waveforms of the respective material-specific reference waveform recording sections 122a to 122l of the reference waveform recording section 120. As a result, it is found that a reference waveform Wb whose waveform and phase match those of the spectral interference waveform W2 belongs to the material-specific reference waveform recording section 122k in the reference waveform recording section 120 depicted in FIG. 7B, and the material-specific reference waveform recording section 122k is selected. That is, it is confirmed that the first layer of the wafer 10W is constituted of the A-layer (LN) and that the second layer of the wafer 10W is constituted of the B-layer ($SiO_2$).

When it is determined that a shape of the spectral interference waveform W2 detected in the thickness outputting means 100 and the reference waveform Wb recorded in the material-specific reference waveform recording section 122k match each other as described above, it is determined that the first layer corresponding to a position at which the reference waveform Wb is recorded in the material-specific reference waveform recording section 122k is LN and that the thickness of the first layer is 4.00 µm, and further it is determined that the second layer is $SiO_2$ and that the thickness of the second layer is 0.27 µm. The thicknesses of the first layer and the second layer are output from the thickness outputting means 100 to be displayed by the display means 130 and are stored in the RAM.

Further, the above-described optical switch 90 can change the path of the white light passing through the first optical path 8a to the second branch path 8a-2 and the third branch path 8a-3, and the thicknesses of the first layer and the second layer at a corresponding condensing position A2 and a corresponding condensing position A3 can be determined and output individually. Here, even when the second layer (lower layer) of the wafer 10W at the condensing positions A1, A2, and A3 is formed by different materials (for example, when the second layer at the position of the condensing position A1 is $SiO_2$ and the second layer at the position of the condensing position A2 is GaN), the thickness of each layer can be measured on a material-by-material basis at each condensing position because of the provision of the material-specific reference waveform recording section 122k and the material-specific reference waveform recording section 122l.

Figure 8:
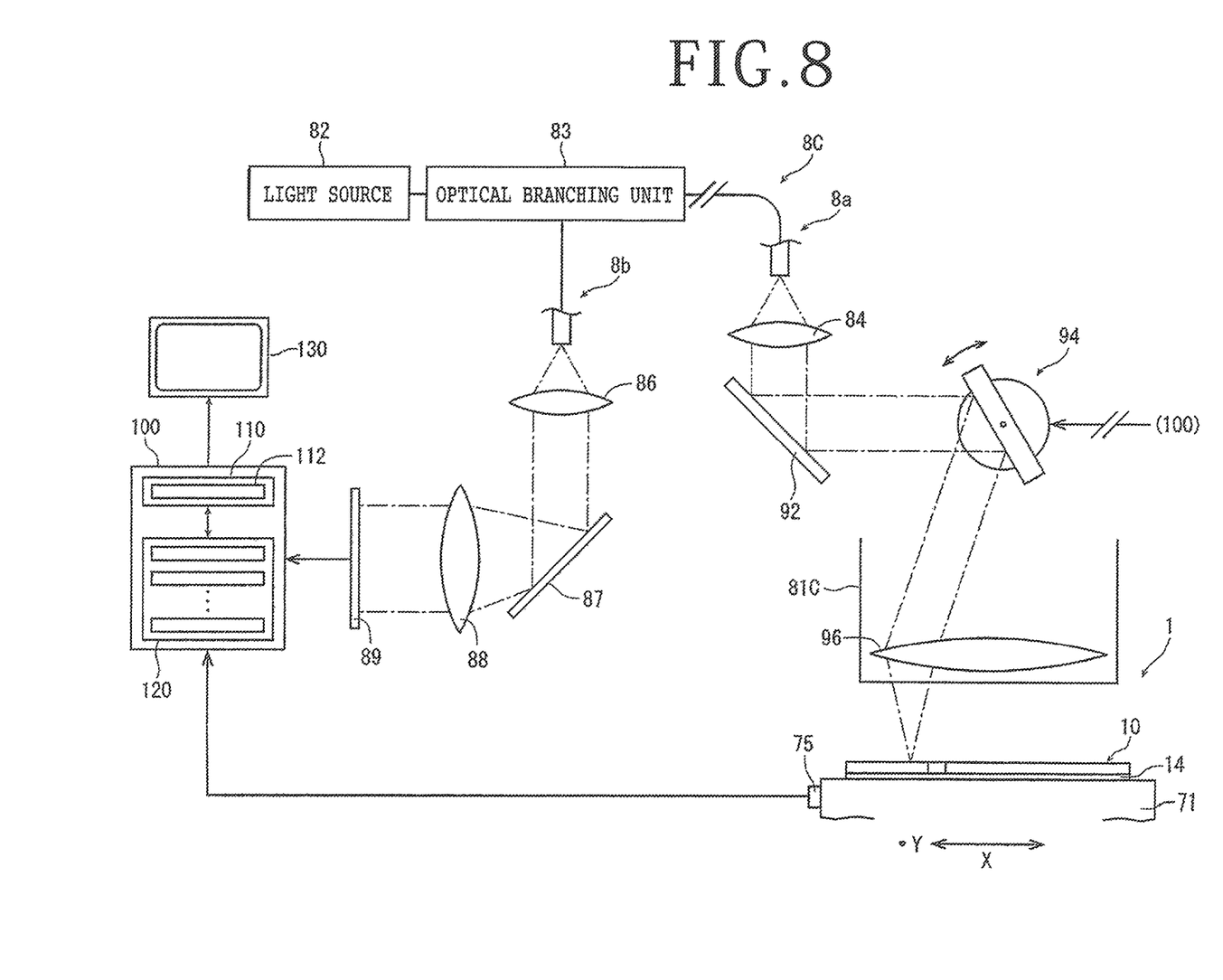
FIG. 8 is a block diagram depicting yet another embodiment of the thickness measuring apparatus.

The present invention is not limited to the thickness measuring apparatus 8A and the thickness measuring apparatus 8B described above, and yet another embodiment is provided. Referring to FIG. 8, description will be made of a thickness measuring apparatus 8C including another condensing position changing means for changing the condensing position to which the white light is condensed in the workpiece, as appropriate. Incidentally, description of configurations common to the thickness measuring apparatus 8A depicted in FIG. 2 will be omitted.

In the thickness measuring apparatus 8C depicted in FIG. 8, the white light communicated through the first optical path 8a is formed into collimated light by the collimation lens 84, the optical path of the white light is changed by a reflecting mirror 92, and the white light is guided to a galvanometer mirror 94 controlled by a control signal from the thickness outputting means 100. The white light whose optical path is changed to a desired position by the galvanometer mirror 94 is guided to an fθ lens 96 and is guided to the wafer 10 on the chuck table 71. The condensing position of the white light is thus changed as appropriate, and the white light is condensed to a desired condensing position. Reflected light reflected at the condensing position of the wafer 10 held on the chuck table 71 is guided to the image sensor 89, and a spectral interference waveform is formed. Then, the thickness of the wafer 10 at the condensing position is determined and output by the above-described procedure.

In the foregoing embodiment, description has been made of measurement of the thickness of the wafer 10 or the composite wafer 10W in a state in which the grinding step described with reference to FIG. 4 is performed. However, the present invention is not limited to this. The above-described thickness measurement can be performed with the chuck table 71 positioned between the workpiece mounting area 70a and the grinding area 70b before the grinding step is performed or after the grinding step is performed.

In the foregoing embodiments, examples in which the thickness measuring apparatuses 8A to 8C are disposed in the grinding apparatus 1 have been illustrated. However, the present invention is not limited to this and may be applied to any processing apparatus such as a polishing apparatus, a laser processing apparatus, or a dicing apparatus as long as the processing apparatus processes the wafer 10 as the workpiece.

In addition, in the foregoing embodiments, examples in which the thickness measuring apparatuses 8A to 8C according to the present invention are disposed in the processing apparatus that processes the workpiece have been illustrated. However, the present invention is not limited to this. The thickness measuring apparatuses 8A to 8C according to the present invention may be an independent thickness measuring apparatus separate from the processing apparatus.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A thickness measuring apparatus having a chuck table holding a workpiece and measuring a thickness of the workpiece held on the chuck table, the thickness measuring apparatus comprising:
   a light source configured to emit white light;
   condensing means for condensing the white light emitted by the light source to the workpiece held on the chuck table;
   a first optical path communicating between the light source and the condensing means;
   an optical branching unit disposed in the first optical path, the optical branching unit branching reflected light reflected from the workpiece held on the chuck table to a second optical path;
   a diffraction grating disposed in the second optical path;
   an image sensor configured to detect an optical intensity signal of light separated into each wavelength by the diffraction grating; and
   thickness outputting means for generating a spectral interference waveform on a basis of the optical intensity signal detected by the image sensor, determining the thickness on a basis of the spectral interference waveform, and outputting the thickness;
   the thickness outputting means including
      a reference waveform recording section having stored therein spectral interference waveforms corresponding to a plurality of thicknesses as reference waveforms, and
      a thickness determining section configured to check the spectral interference waveform generated on the basis of the optical intensity signal detected by the image sensor against the reference waveforms recorded in the reference waveform recording section and determine the thickness from a reference waveform that the spectral interference waveform matches,
   the reference waveform recording section having a plurality of material-specific reference waveform recording sections configured to record the reference waveforms according to a material constituting the workpiece.

2. The thickness measuring apparatus according to claim 1, wherein
   the thickness determining section of the thickness outputting means checks the spectral interference waveform generated on the basis of the optical intensity signal detected by the image sensor against the reference waveforms recorded in the plurality of material-specific reference waveform recording sections included in the reference waveform recording section and selects a material-specific reference waveform recording section to which the reference waveform that the spectral interference waveform matches belongs.

3. The thickness measuring apparatus according to claim 1, wherein
   the workpiece has a thickness direction and a lateral direction orthogonal to the thickness direction, and wherein
   the condensing means includes condensing position changing means for laterally changing a condensing position to which the white light is condensed in the workpiece, and the thickness is measured according to two or more kinds of materials constituting the workpiece.

4. The thickness measuring apparatus according to claim 3, wherein the workpiece comprises a first lateral position and a second lateral position;
   wherein the condensing position changing means is configured to allow the white light to be condensed at the first lateral position and at the second lateral position; and
   wherein the thickness determining section is configured to determine the thickness of the workpiece at both the first lateral position and the second lateral position.

5. The thickness measuring apparatus according to claim 1, wherein
   the workpiece is a composite wafer formed including at least a first layer and a second layer.

6. The thickness measuring apparatus according to claim 1, wherein
   the workpiece is formed of two or more kinds of materials, and the workpiece is a composite wafer formed including at least a first layer and a second layer, the first layer or the second layer being formed of two or more kinds of materials in a planar direction.

7. The thickness measuring apparatus according to claim 1, wherein
   the light source is selected from a group consisting of a superluminescent diode light source, an amplified spontaneous emission light source, a supercontinuum light source, a light-emitting diode light source, a halogen light source, a xenon light source, a mercury light source, and a metal halide light source.

8. The thickness measuring apparatus according to claim 1, wherein each material-specific reference waveform recording section comprises a corresponding reference waveform for each of a plurality of thicknesses, each material-specific reference waveform recording section being associated with a different material or a composite having a plurality of layers of different materials.

9. The thickness measuring apparatus according to claim 1, wherein the optical branching unit comprises a polarization maintaining fiber coupler, a polarization maintaining fiber circulator, a single mode fiber coupler, or a single mode fiber coupler circulator.

10. The thickness measuring apparatus according to claim 9, wherein a part of the first optical path is formed by an optical fiber and wherein a part of the second optical path is formed by an optical fiber.

11. The thickness measuring apparatus according to claim 1, wherein the plurality of material-specific reference waveform recording sections comprise: a silicon wafer reference waveform recording section comprising a corresponding reference waveform for each of a plurality of thicknesses of silicon wafers; a lithium niobate wafer reference waveform recording section comprising a corresponding reference waveform for each of a plurality of thicknesses of lithium niobate wafers; a gallium nitride wafer reference waveform recording section comprising a corresponding reference waveform for each of a plurality of thicknesses of gallium nitride wafers; and/or a silicon dioxide wafer reference waveform recording section comprising a corresponding reference waveform for each of a plurality of thicknesses of silicon dioxide wafers.

12. A thickness measuring apparatus having a chuck table holding a workpiece and measuring a thickness of the workpiece held on the chuck table, the thickness measuring apparatus comprising:
   a light source configured to emit white light;
   an optical branching unit receiving the emitted white light and directing the white light to a first optical path;
   a condenser positioned in the first optical path for condensing the white light emitted by the light source to the workpiece held on the chuck table;
   the optical branching unit receiving light reflected from the workpiece held on the chuck table along the first optical path and directing the received reflected light to a second optical path;
   a diffraction grating disposed in the second optical path separating light into a plurality of wavelengths;
   an image sensor configured to detect an optical intensity signal of light separated into each wavelength by the diffraction grating; and
   thickness outputting means for generating a spectral interference waveform on a basis of the optical intensity signal detected by the image sensor, determining the thickness on a basis of the spectral interference waveform, and outputting the thickness;
   the thickness outputting means including
      a reference waveform recording section having stored therein spectral interference waveforms corresponding to a plurality of thicknesses as reference waveforms, and
      a thickness determining section configured to check the spectral interference waveform generated on the basis of the optical intensity signal detected by the image sensor against the reference waveforms recorded in the reference waveform recording section and determine the thickness from a reference waveform that the spectral interference waveform matches,
   the reference waveform recording section having a plurality of material-specific reference waveform recording sections configured to record the reference waveforms according to a material constituting the workpiece.

13. The thickness measuring apparatus according to claim 12, wherein each material-specific reference waveform recording section comprises a corresponding reference waveform for each of a plurality of thicknesses, each material-specific reference waveform recording section being associated with a different material or a composite having a plurality of layers of different materials.

14. The thickness measuring apparatus according to claim 12, wherein a part of the first optical path is formed by an optical fiber and wherein a part of the second optical path is formed by an optical fiber.

15. The thickness measuring apparatus according to claim 12, wherein the plurality of material-specific reference waveform recording sections comprise: a silicon wafer reference waveform recording section comprising a corresponding reference waveform for each of a plurality of thicknesses of silicon wafers; a lithium niobate wafer reference waveform recording section comprising a corresponding reference waveform for each of a plurality of thicknesses of lithium niobate wafers; a gallium nitride wafer reference waveform recording section comprising a corresponding reference waveform for each of a plurality of thicknesses of gallium nitride wafers; and/or a silicon dioxide wafer reference waveform recording section comprising a corresponding reference waveform for each of a plurality of thicknesses of silicon dioxide wafers.

16. The thickness measuring apparatus according to claim 12, wherein
   the thickness determining section of the thickness outputting means checks the spectral interference waveform generated on the basis of the optical intensity signal detected by the image sensor against the reference waveforms recorded in the plurality of material-specific reference waveform recording sections included in the reference waveform recording section and selects a material-specific reference waveform recording section to which the reference waveform that the spectral interference waveform matches belongs.

17. The thickness measuring apparatus according to claim 12, wherein
   the workpiece has a thickness direction and a lateral direction orthogonal to the thickness direction, and wherein
   the condenser includes condensing position changing means for laterally changing a condensing position to which the white light is condensed in the workpiece, and the thickness is measured according to two or more kinds of materials constituting the workpiece.

18. The thickness measuring apparatus according to claim 17, wherein the condensing position changing means comprises an optical switch.

19. The thickness measuring apparatus according to claim 17, wherein the workpiece comprises a first lateral position and a second lateral position;
   wherein the condensing position changing means is configured to allow the white light to be condensed at the first lateral position and at the second lateral position; and
   wherein the thickness determining section is configured to determine the thickness of the workpiece at both the first lateral position and the second lateral position.

20. The thickness measuring apparatus according to claim 12, wherein
   the workpiece is a composite wafer formed including at least a first layer and a second layer.

21. The thickness measuring apparatus according to claim 12, wherein
   the workpiece is formed of two or more kinds of materials, and the workpiece is a composite wafer formed including at least a first layer and a second layer, the first layer or the second layer being formed of two or more kinds of materials in a planar direction.

* * * * *